(12) United States Patent
Grenzebach et al.

(10) Patent No.: US 10,854,274 B1
(45) Date of Patent: Dec. 1, 2020

(54) APPARATUSES AND METHODS FOR DYNAMIC TIMING OF ROW PULL DOWN OPERATIONS

(71) Applicant: MICRON TECHNOLOGY, INC., Boise, ID (US)

(72) Inventors: Adam J. Grenzebach, Boise, ID (US); Timothy B. Cowles, Boise, ID (US); Beau D. Barry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/584,746

(22) Filed: Sep. 26, 2019

(51) Int. Cl.
*G11C 11/4076* (2006.01)
*G11C 11/408* (2006.01)
*G11C 11/4074* (2006.01)

(52) U.S. Cl.
CPC ...... *G11C 11/4085* (2013.01); *G11C 11/4074* (2013.01); *G11C 11/4076* (2013.01); *G11C 11/4087* (2013.01)

(58) Field of Classification Search
CPC .................................. G11C 8/10; G11C 16/10
USPC ........................................ 365/185.24, 230.06
See application file for complete search history.

(56) References Cited

U.S. PATENT DOCUMENTS

| | | | |
|---|---|---|---|
| 6,028,813 A | 2/2000 | Choi | |
| 6,178,122 B1 | 1/2001 | Tomishima et al. | |
| 6,337,832 B1 | 1/2002 | Ooishi et al. | |
| 6,421,295 B1 | 7/2002 | Mao et al. | |
| 6,507,532 B1 | 1/2003 | Fujino et al. | |
| 7,251,160 B2* | 7/2007 | Li | G11C 11/5642 365/185.03 |
| 7,492,640 B2* | 2/2009 | Mokhlesi | G11C 16/26 365/185.02 |
| 7,529,131 B2* | 5/2009 | Iwai | G11C 11/5642 365/185.17 |
| 8,358,535 B2 | 1/2013 | Chae et al. | |
| (Continued) | | | |

FOREIGN PATENT DOCUMENTS

KR     20140136766 A     12/2014

OTHER PUBLICATIONS

International Application No. PCT/US20/26423, titled "Apparatuses and Methods for Controlling Word Line Discharge", dated Apr. 2, 2020, pp. all.

(Continued)

*Primary Examiner* — Michael T Tran
(74) *Attorney, Agent, or Firm* — Dorsey & Whitney LLP

(57) ABSTRACT

Apparatuses, systems and methods for dynamic timing of row pull-down operations are described herein. When a word line is accessed, the row decoder may drive that word line to an active voltage, and then to an intermediate voltage. The row decoder may maintain that word line at the intermediate voltage until another word line in the same group of word lines as the accessed word line receives an access command, at which point the first word line is driven to an inactive voltage. For example, if the word lines are grouped by bank, then after an access to a first word line, the first word line may be maintained at the intermediate voltage until a second wordline in the same bank as the first word line is accessed. This may help to mitigate the effect on other nearby word lines of driving a word line to the inactive voltage.

18 Claims, 6 Drawing Sheets

(56) References Cited

U.S. PATENT DOCUMENTS

| | | | |
|---|---|---|---|
| 8,395,936 B2* | 3/2013 | Li | G11C 16/3459 |
| | | | 365/185.03 |
| 8,804,446 B2 | 8/2014 | Okahiro | |
| 8,891,325 B2 | 11/2014 | Choi et al. | |
| 8,953,407 B2 | 2/2015 | Yun et al. | |
| 9,111,633 B2 | 8/2015 | Kim | |
| 9,373,378 B1 | 6/2016 | Chen | |
| 9,412,447 B1* | 8/2016 | Bertin | G11C 29/028 |
| 9,418,711 B2 | 8/2016 | Ohgarni | |
| 9,653,131 B1 | 5/2017 | Yamanaka et al. | |
| 9,824,746 B1 | 11/2017 | Lee | |
| 9,922,726 B2 | 3/2018 | Choi | |
| 10,008,256 B1 | 6/2018 | Kim | |
| 10,014,063 B2* | 7/2018 | Tseng | G11C 29/028 |
| 10,347,321 B1 | 7/2019 | Yamanaka et al. | |
| 10,490,256 B2 | 11/2019 | Jeong | |
| 10,529,400 B1 | 1/2020 | Mahatme et al. | |
| 10,614,893 B2 | 4/2020 | Miyazaki | |
| 10,636,469 B2 | 4/2020 | El-Mansouri et al. | |
| 10,650,882 B2 | 5/2020 | Lin et al. | |
| 10,665,271 B2 | 5/2020 | Takeda et al. | |
| 10,672,443 B2 | 6/2020 | Gupta et al. | |
| 10,685,709 B2 | 6/2020 | Tanaka et al. | |
| 2002/0001215 A1 | 1/2002 | Fujisawa et al. | |
| 2002/0051377 A1 | 5/2002 | Choi et al. | |
| 2002/0080677 A1 | 6/2002 | Watanabe et al. | |
| 2003/0095438 A1 | 5/2003 | Hosogane | |
| 2004/0004899 A1 | 1/2004 | Choi | |
| 2004/0052146 A1 | 3/2004 | Sim | |
| 2004/0156260 A1 | 8/2004 | Lee | |
| 2004/0196719 A1 | 10/2004 | Aritomi et al. | |
| 2005/0128858 A1 | 6/2005 | Lee et al. | |
| 2005/0226086 A1 | 10/2005 | Sugawara | |
| 2006/0158953 A1 | 7/2006 | Takahashi | |
| 2006/0176758 A1 | 8/2006 | Chun | |
| 2007/0008807 A1 | 1/2007 | Jeong | |
| 2007/0030741 A1 | 2/2007 | Nii et al. | |
| 2008/0031060 A1 | 2/2008 | Choi et al. | |
| 2008/0123463 A1 | 5/2008 | Matsubara | |
| 2009/0161418 A1 | 6/2009 | Yoon | |
| 2010/0046313 A1 | 2/2010 | Lee et al. | |
| 2010/0142306 A1 | 6/2010 | Nakamura et al. | |
| 2010/0149900 A1 | 6/2010 | Kitayama | |
| 2010/0157716 A1 | 6/2010 | Lee | |
| 2011/0199837 A1 | 8/2011 | Reohr et al. | |
| 2011/0228624 A1 | 9/2011 | Kim et al. | |
| 2012/0120751 A1 | 5/2012 | Okahiro | |
| 2012/0147686 A1 | 6/2012 | Takayama et al. | |
| 2012/0257437 A1 | 10/2012 | Seko et al. | |
| 2012/0287699 A1 | 11/2012 | Yun et al. | |
| 2012/0327108 A1 | 12/2012 | Kato et al. | |
| 2013/0135915 A1 | 5/2013 | Kim | |
| 2013/0215697 A1 | 8/2013 | Choi et al. | |
| 2013/0329495 A1* | 12/2013 | Shiino | G11C 11/5642 |
| | | | 365/185.09 |
| 2014/0369149 A1 | 12/2014 | Park | |
| 2015/0098260 A1 | 4/2015 | Ohgami | |
| 2015/0255146 A1 | 9/2015 | Mochida | |
| 2015/0364174 A1 | 12/2015 | Ahn et al. | |
| 2016/0095178 A1 | 3/2016 | Kuang et al. | |
| 2017/0075595 A1* | 3/2017 | Maejima | G06F 11/0793 |
| 2017/0103798 A1 | 4/2017 | Mochida | |
| 2017/0178751 A1 | 6/2017 | Choi | |
| 2017/0271021 A1* | 9/2017 | Futatsuyama | G11C 16/26 |
| 2017/0278579 A1* | 9/2017 | Lee | G11C 16/08 |
| 2018/0040362 A1* | 2/2018 | Kwak | G11C 11/4082 |
| 2018/0074896 A1* | 3/2018 | Takada | G06F 11/1072 |
| 2018/0166119 A1 | 6/2018 | Jeong | |
| 2018/0277182 A1 | 9/2018 | Inaba | |
| 2019/0013055 A1 | 1/2019 | Ohgami | |
| 2019/0035466 A1* | 1/2019 | Kim | G11C 16/0483 |
| 2019/0088333 A1* | 3/2019 | Shirakawa | G11C 16/12 |
| 2019/0180812 A1 | 6/2019 | Sung et al. | |
| 2019/0189186 A1 | 6/2019 | Won et al. | |
| 2019/0214293 A1 | 7/2019 | Kim et al. | |
| 2019/0385649 A1* | 12/2019 | Kawamura | G11C 5/148 |
| 2020/0027489 A1* | 1/2020 | Choi | G11C 7/225 |
| 2020/0075110 A1* | 3/2020 | Suzuki | G11C 16/3431 |
| 2020/0105352 A1* | 4/2020 | Tanzawa | G11C 16/3459 |
| 2020/0111517 A1 | 4/2020 | Seo et al. | |
| 2020/0143890 A1* | 5/2020 | Lee | G11C 16/12 |
| 2020/0152249 A1 | 5/2020 | Kawamura | |
| 2020/0294571 A1* | 9/2020 | Shin | G11C 11/4085 |
| 2020/0295021 A1* | 9/2020 | Maejima | H01L 27/11582 |

OTHER PUBLICATIONS

U.S. Appl. No. 16/378,524 titled "Apparatuses and Methods for Controlling Driving Signals in Semiconductor Devices", filed Apr. 8, 2019, pp. all.

U.S. Appl. No. 16/382,856 titled "Apparatuses and Methods for Controlling Word Line Discharge", filed Apr. 12, 2019. pp. all.

U.S. Appl. No. 16/450,696 titled "Apparatuses and Methods for Controlling Word Line Discharge", filed Jun. 24, 2019, pp. all.

U.S. Appl. No. 16/450,723 titled "Apparatuses and Methods for Controlling Word Line Discharge", filed Jun. 24, 2019, pp. all.

U.S. Appl. No. 16/450,737 titled "Apparatuses and Methods for Controlling Word Line Discharge", filed Jun. 24, 2019, pp. all.

U.S. Appl. No. 16/853,417, titled "Apparatuses and Methods for Providing Main Word Line Signal With Dynamic Well", dated Apr. 20, 2020, pp. all.

U.S. Appl. No. 17/038,604 titled "Apparatuses and Methods for Controlling Word Line Discharge" filed Sep. 30, 2020; pp. all.

* cited by examiner

APPARATUSES AND METHODS FOR DYNAMIC TIMING OF ROW PULL DOWN OPERATIONS

BACKGROUND

A semiconductor memory device represented by a DRAM (Dynamic Random Access Memory) includes a memory cell array having memory cells disposed at intersections between word lines and bit lines. The semiconductor memory device may include hierarchically structured main word lines and subword lines. The main word line is a word line positioned at an upper hierarchy, and is selected by a first portion of a row address. The subword line is a word line positioned at a lower hierarchy, and is selected based on a corresponding main word line (MWL) and a word driver line (FX) selected by a second portion of the row address.

A memory cell array included in a semiconductor memory device such as the DRAM may be divided into a plurality of memory mats to reduce the wiring capacitance of the subword line and the bit line. The main word line described above is assigned in plurals to one memory mat, so that when the main word line is selected using the first portion of the row address, the memory mat to be selected is also determined at the same time.

The driving process of the subword lines is carried out by subword drivers, and when the subword line is driven to an active potential, the memory cell is connected to the corresponding bit line. On the other hand, during a period in which the subword line is driven to a non-active potential, the memory cell and the bit line are kept in a cut-off state.

DETAILED DESCRIPTION

Figure 1:
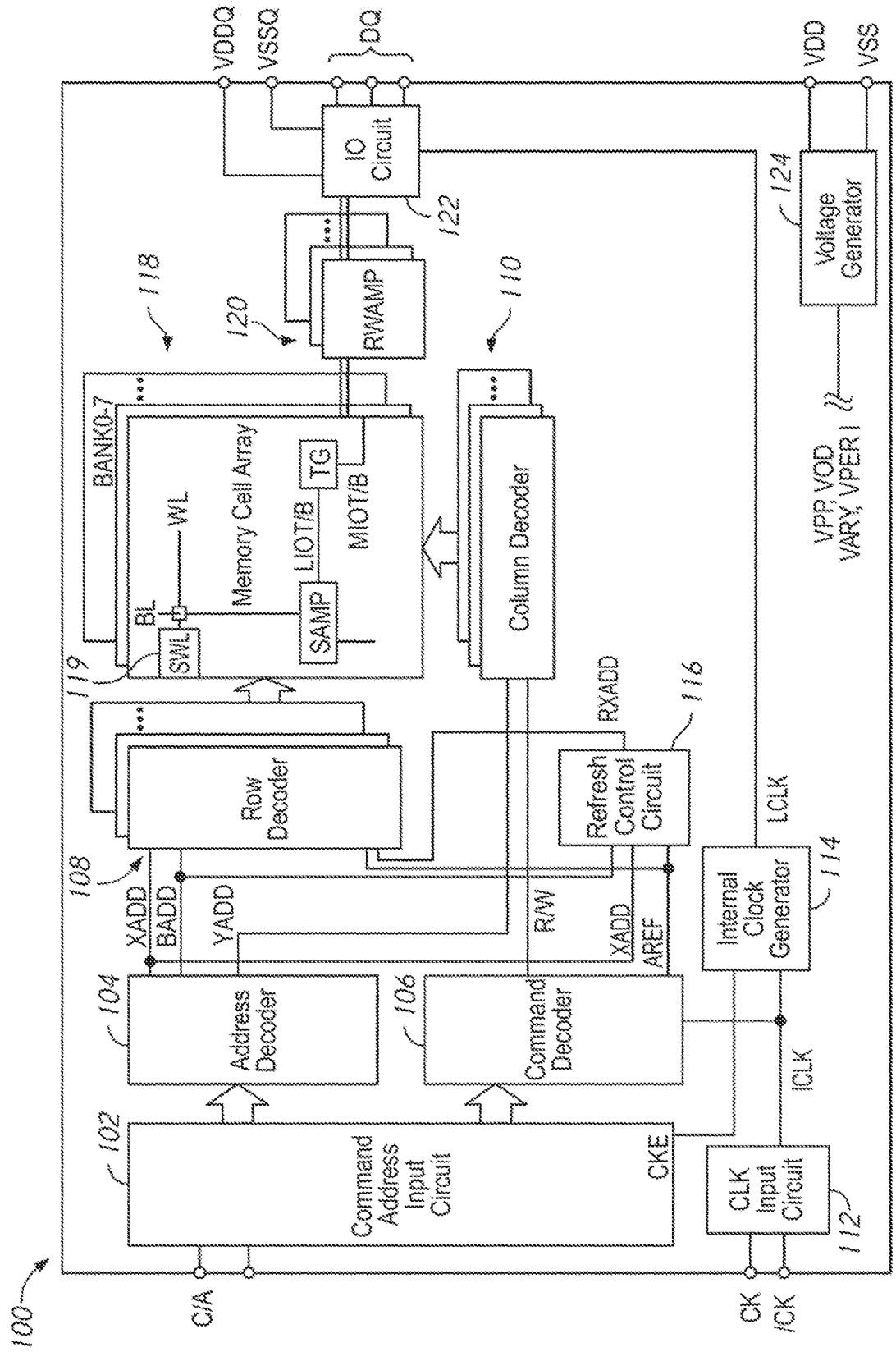
FIG. 1 is a block diagram of a semiconductor device according an embodiment of the disclosure.

Certain details are set forth below to provide a sufficient understanding of examples of various embodiments of the disclosure. However, it will be clear to one having skill in the art that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

A memory device may include a number of memory cells which store data. The memory cells may be arranged along rows and columns, where the rows are coupled together by word lines and the columns are coupled together by bit lines (or 'digit lines'). In an example operation, the memory may access one or more memory cells by activating a word line (e.g., by changing the potential of the wordline from an first voltage level to a second voltage) and then reading information from one or more of the memory cells along the activated wordline out along the bit lines. Once accesses to a particular word line is finished, the word line may be deactivated by returning it to the first voltage as part of a 'pull-down' operation. However, the pull-down operation (e.g., by driving the voltage along the word line from the second voltage back to the first voltage) may increase a rate of data decay in the memory cells along word lines which are near the accessed word line. For example, if a particular word line is repeatedly accessed as part of a 'row hammer', then the multiple pull downs may increase a rate of data decay in word lines neighboring the hammered word line.

In order to mitigate or eliminate the effect of the pull-down operation on nearby word lines, an intermediate voltage may be used. The word line may be driven to an intermediate voltage (e.g., a voltage between the first and the second voltages) after the access operation is complete. It may be desirable to maximize the time a given wordline spends at the intermediate voltage, however the word line may need to be returned to a first voltage when certain other word lines are accessed to prevent data corruption. For example, word lines may be considered to belong to various groups (e.g., banks, mats, sub-mats, etc.), and all the word lines of a group may need to be at the first voltage when a wordline of that group is accessed (e.g., raised to the second voltage).

The present disclosure is drawn to apparatuses, systems, and methods for dynamic timing of a row pull-down operation. After a first word line is accessed by raising it to a second voltage level, the word line may be driven to a third voltage level which is an intermediate voltage. The word line may be kept at the third voltage level until a second word line, which is part of the same group of word lines as the first word line, is accessed at which point the word line may be driven from the third voltage level back to the first voltage level. By extending the time at which one or more word lines are kept at the third voltage level, the information decay caused by the drop from the second to the first voltage level may be mitigated.

For example, if a group of wordlines is considered to be a bank, a first word line in a memory bank may be accessed, by raising the potential of the first word line from an inactive voltage to an active voltage for a period of time. After the period of time, the first word line may be driven to an intermediate voltage. The first word line may remain at the intermediate voltage level until an access command is received for a second word line in the same memory bank, at which point the first word line is driven to the inactive voltage level. Other examples may use groups which include different levels of organization of wordlines, such as keeping a word line at the third voltage level until an access command is received for a word line which is physically adjacent to the accessed word line. In some embodiments, if a second access command is received for the first word line it may be raised from the intermediate voltage to the active voltage and then returned to the intermediate voltage, without needing to be changed to the inactive voltage. In some embodiments, a word line may remain at the third voltage level until either a nearby word line is accessed or a maximum amount of time has passed.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

Each wordline WL of the memory array 118 is coupled to a sub-word line driver (SWL driver) 119, which may control a state of the word line. For example, the SWL driver 119 may receive signals from the row decoder, such as a phase signal Phase and a voltage GROW. The signal Phase may indicate to the SWL driver 119 whether to activate the associated word line WL or not. The voltage signal GROW may indicate to the SWL driver 119 what voltage to keep the word line WL at when the signal Phase indicates that the word line WL is activate. For example, when the Phase signal indicates that the word line WL is inactive, the W L may be coupled to an inactive voltage level (e.g., a ground voltage such as VSS). When the signal Phase indicates that the word line WL is active, the WL may be coupled to the voltage GROW. The row decoder 108 may use internal logic to determine the states of the signals Phase and GROW for each of the of the word lines coupled to that row decoder 108 based on the received row address(es) XADD.

Each row decoder 108 may be coupled to a number of different word lines. For example, as shown in the example of FIG. 1, there may be a separate row decoder 108 for each bank of the memory. Accordingly, in an embodiment such as the one in FIG. 1, each row decoder 108 may be coupled to all of the SWL drivers 119 (and thus to all of the word lines) in the bank of the memory array 118 associated with that row decoder 108. In some embodiments, intermediate levels of organization of the memory (e.g., such as main word lines MWL) may be used to couple a given row decoder 108 to a given SWL driver 119. Each row decoder 108 may multiple values of the signal Phase and the voltage GROW, each to one of the SWL drivers 119 coupled to that row decoder 108. Thus, a given SWL driver for an ith word line SWL(i) may receive a value of the signal Phase(i) and a voltage GROW(i).

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

When the device 100 receives an access command to a given word line WL (e.g., a read command), the row address XADD associated with that WL may be provided from the address decoder 104 to the row decoder 108. As part of the access command, the row decoder 108 may send signals to the SWL driver 119 associated with that WL to cause the WL to be raised to an activated voltage level. For example, the row decoder 108 may provide the signal Phase to the SWL driver 119 at a level which causes the word line WL to be coupled to the voltage GROW, and may provide the voltage GROW to that SWL driver 119 at an active voltage level. While the WL is at the active voltage level, data may be read out from one or more memory cells along the bit lines BL coupled to those memory cells to the sense amplifier SAMP. After the data is read out, the row decoder 108 may direct the SWL driver 119 to change the voltage of the word line WL to an intermediate voltage. For example, by changing the voltage GROW provided to that SWL driver 119 to the intermediate voltage.

The row decoder 108 may keep the word line WL at the intermediate voltage until a new access command is received for a word line which is part of the same group of wordlines as the word line WL. For example, the word line WL may remain at the intermediate voltage until an access command is received for a different word line in the same bank as the word line WL. If an access command is received for a word line which is part of a different group (e.g., the new word line is in a different bank from the word line WL), then the word line WL may be kept the intermediate voltage. When an access command for a word line in the same group as the word line WL is received, the word line WL may be changed to an inactivated voltage. In this manner, multiple word lines may be kept at the intermediate voltage for variable amounts of time. Different levels of grouping wordlines (e.g., bank-by-bank, mat-by-mat, sub-mat-by-sub-mat, adjacent rows, etc.) may be used in different embodiments of the present disclosure. The row decoder 108 may determine which group (or groups) of word lines a given access command is directed to based on one or more bits of the row address XADD and/or bank address. For example, if the word lines are grouped by bank, then the row decoders 108 may respond to the value of the bank address BADD.

In some embodiments, the device 100 may have a maximum amount of time that a given word line may remain at the intermediate voltage level. In such embodiments, the row decoder 108 may have a timer (which may or may not be synchronized to one or more signals from the CLK circuit 112, such as ICLK) and may count how long a given SWL driver 119 has been signaled to provide the intermediate voltage. If the maximum time is reached (e.g., if the count of time exceeds a threshold), the SWL driver 119 may be signaled to change the word line WL to the inactivated voltage, even if no access command is received.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
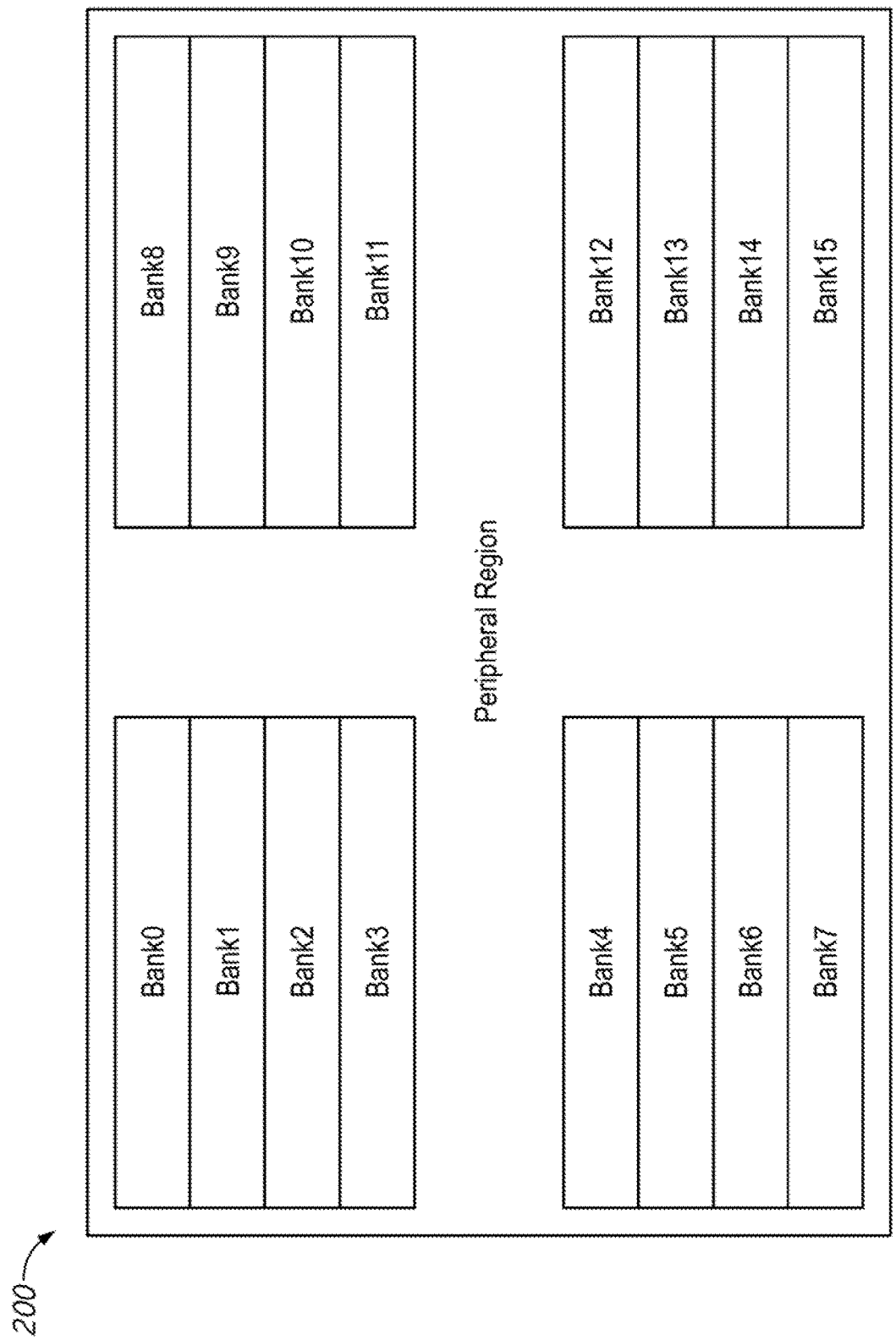
FIG. 2 is a diagram for an example layout of a memory cell array of a semiconductor device according to an embodiment of the disclosure

FIG. 2 is a diagram for an example layout of a memory cell array of a semiconductor device according to an embodiment of the disclosure. In some embodiments of the disclosure, the memory cell array may be included in the memory cell array 118 of the semiconductor device 100 (FIG. 1).

The memory cell array 200 of the example shown in FIG. 2 is divided into sixteen banks BK0 to BK15. Other example embodiments may include more or fewer banks. A row decoder circuit (e.g., row decoder circuit 108 of FIG. 1; not shown in FIG. 2) may be disposed between adjacent banks and /or in the peripheral circuit region PE. On the other peripheral circuit region PE, various peripheral circuits and external terminals may be disposed (not shown in FIG. 2). Each bank may be associated with a different value of a bank address (e.g., BADD of FIG. 1). For example, in the embodiment shown in FIG. 2 where there am sixteen different banks, then the bank address may be 4 bits long (e.g., with sixteen distinct values). In some embodiments, the bank address may be combined into the row address (e.g., in this example four of the bits of the row address XADD may indicate a bank).

In an example operation, if an access command is received for a word line in Bank8, the word line associated with that access command may be raised to an activated voltage for a period of time, and then driven to an intermediate voltage (e.g., by providing the signal Phase and then driving the voltage level of the voltage GROW provided to the SWL driver associated with that word line). The word line may generally be kept at the intermediate voltage until a second access command is received for a different word line in Bank8.

Figure 3:
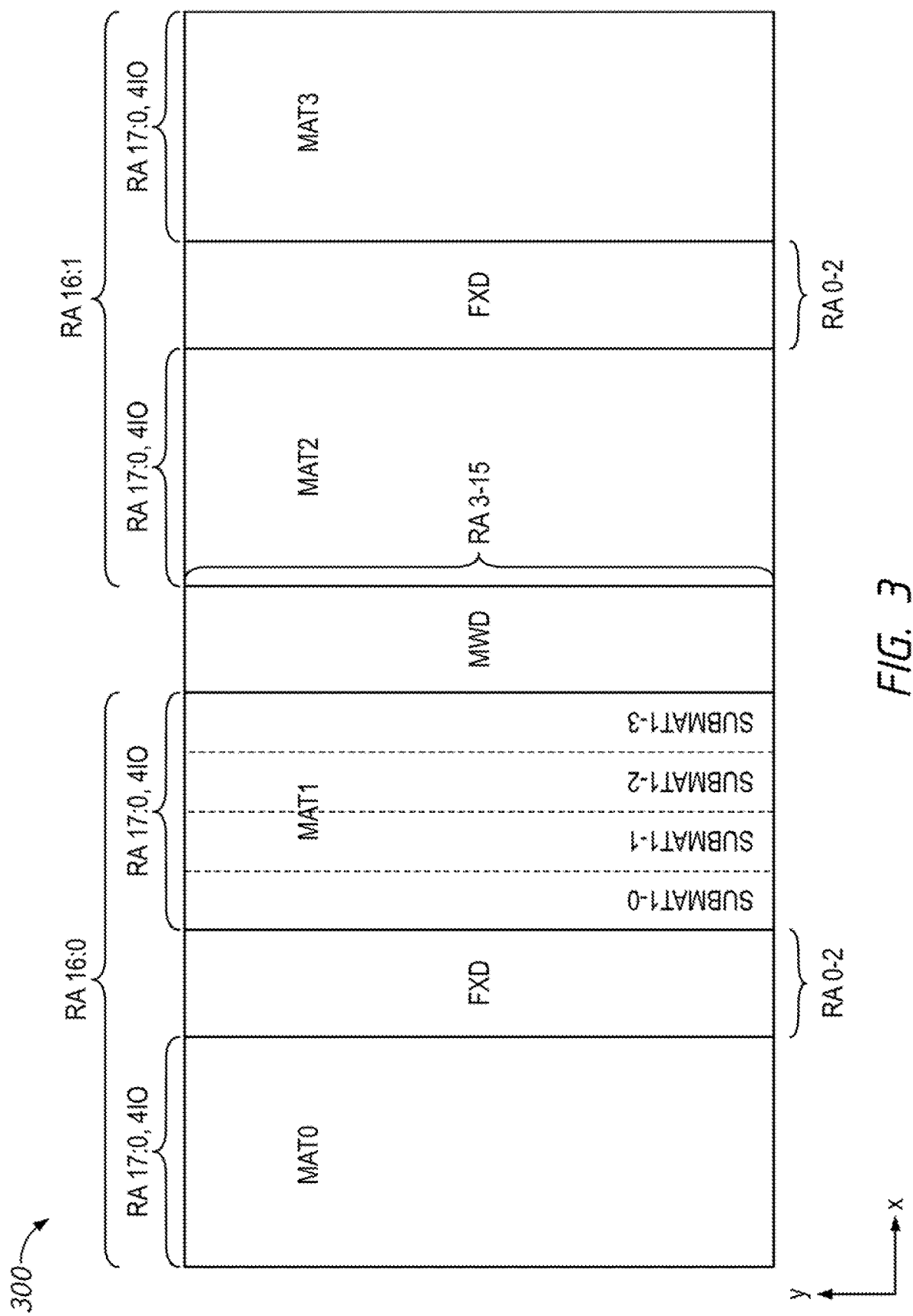
FIG. 3 is a diagram for a configuration of a bank of a memory cell array of a semiconductor device according to an embodiment of the disclosure.

FIG. 3 is a diagram for a configuration of a bank of a memory cell array according to an embodiment of the disclosure. The banks BK0 to BK15 of FIG. 2 may each include the configuration the bank 300 of FIG. 3 in some embodiments of the disclosure. FIG. 3 shows different levels of organization within a bank that may be used to direct access operations to a particular word line. The levels of organization shown in FIG. 3, may, in some embodiments, be used to group word lines together for the purpose of determining when to change the voltage of a word line from an intermediate voltage to an inactive voltage.

As shown in FIG. 3, the bank 300 includes a plurality of memory mat regions MAT0-3. In the example shown in FIG. 3, the bank 300 has four memory mat regions, but the bank 300 could include more or fewer memory mat regions in other examples. As indicated by the dotted lines in memory mat region MAT1, each memory mat region may be divided into multiple sub-regions SUBMAT1-0-3. While the example shown in FIG. 3 includes four sub-regions, memory mat regions MAT0-3 may include more or fewer sub-regions in other examples. Each sub-region SUBMAT1-0-3 may include a plurality of memory mats aligned in the Y-direction. In some embodiments, there may be about 64 memory mats along the Y-direction, more or fewer memory mats may be used. For clarity, the individual memory mats are not shown in FIG. 3. Not shown in FIG. 3, subword driver rows SWDA may be on the two sides in the X direction of each memory mat, and sense amplifier rows SAA may be on the two sides in the Y direction of each memory mat. The memory mats of each sub-region SUBMAT1-0-3 may be provided to a corresponding IO (e.g., DQ pad) in some embodiments.

The subword driver operations are controlled by a row decoder circuit (not shown in FIG. 3), for example, the row decoder circuit 108 of FIG. 1. When a row address XADD (or RA) is inputted thereto, the row decoder selects a sub-word line by activating an appropriate main word driver (MWD) and an appropriate word driver (FXD) indicated by the row address RA. In the example shown in FIG. 3, one block is shown for the main word driver MWD, however, the main word driver MWD block may include a plurality of main word drivers MWDs. Similarly, two blocks are shown for the word drivers FXDs, but each word driver FXD block may include a plurality of word drivers FXDs. For example, if each memory mat region MAT includes four sub-regions and each sub-region includes 64 memory mats, the main word driver MWD block may include 128 MWD, each configured to activate a corresponding main word line (MWL). Continuing this example, each word driver FXD block may include eight word drivers FXDs, each configured to activate a corresponding word driver line (FX). In the example shown in FIG. 3, bits 3-15 of the row address RA encode the main word line MWL and bits 0-2 of the row address RA encode the word driver line FX. However, other encoding schemes may be used.

In an example embodiment which uses the mats to group word lines together, a row decoder may receive a memory address RA. The value of RA0-15 may indicate a particular FXD and MWD, and thus a particular memory mat. A word line in the mat associated with the received address RA may be raised to an activated voltage and then held at an intermediate voltage until a different address is received which is in the same mat as the first address (e.g., the same value of RA0-15), at which time the first word line may be changed to an inactivated voltage.

Figure 4:
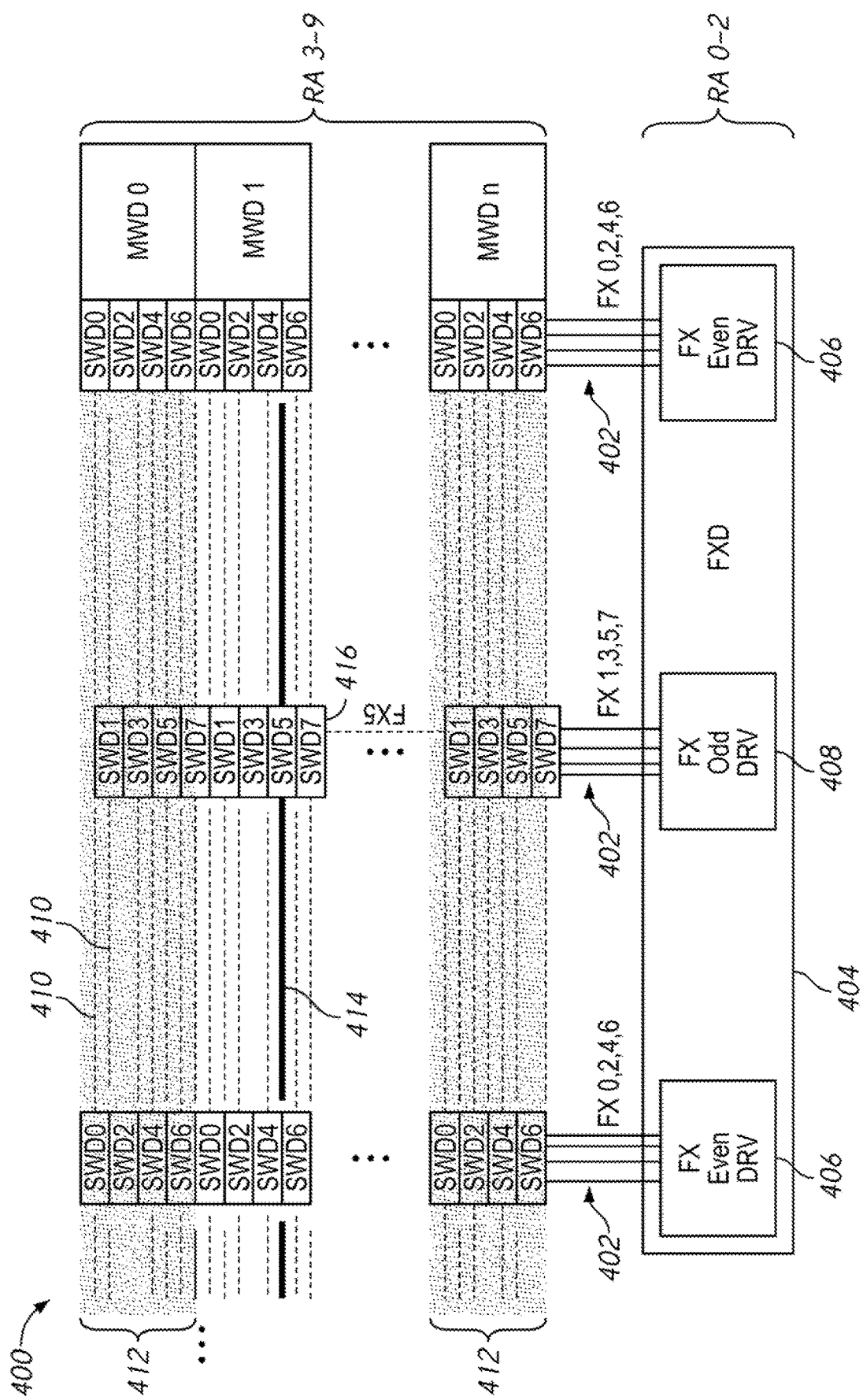
FIG. 4 is a schematic diagram of a portion of a bank of a memory cell array according to an embodiment of the disclosure.

FIG. 4 is a schematic diagram of a portion of a bank 400 according to an embodiment of the disclosure. In some embodiments of the disclosure, the portion of the bank 400 shown in FIG. 4 may be included in the bank 300 of FIG. 3, the memory cell array 200 of FIG. 2, and /or the memory array 118 of FIG. 1.

The subword lines are adjacent to each other, and driven by subword drivers SWD0-7 (e.g., the SWL drivers 119 of FIG. 1) on different subword driver rows. Corresponding main word signals (not shown) driving signals FX and non-active potential VSS/Gnd (not shown) are provided to the subword drivers SWD0-7. The main word signals and the driving signals FX are signals that may be provided by main word drivers MWD0-N and word drivers FXD 404 from the row decoder (e.g., row decoder 108 of FIG. 1), based upon the row address RA as described with reference to FIG. 3. The main word signal is provided to the subword drivers SWD0-7 over a main word line (not shown in FIG. 4), and the driving signals FX are provided to the subword drivers SWD0-7 over word driver lines 402.

A main word line MWL may extend over array regions of a respective memory mat (e.g., a memory mat in SUBMAT1-0 in FIG. 3) to provide the main word signal to the subword driver rows SWD0-7 of the memory mat to activate the subword drivers SWD0-7 of the memory mat. That is, when a main word driver MWD is activated, it may provide active main word signals to all the subword drivers SWD0-7 of the mat. As will be described below, the driving signals FX include complementary signals FXT and FXF. Each word driver line 402 of word driver FXD 404 provides driving signals FX to at least one subword driver SWD in each mat. In the example shown in FIG. 4, the word driver FXD 404 includes even word drivers 406 and odd word drivers 408. The even word drivers 406 provide respective driving signals to even numbered subword drivers SWD0, SWD2, SWD4, and SWD6, of each memory mat and odd word drivers 408 provide respective driving signals to odd numbered subword drivers SWD1, SWD3, SWD5, and SWD7 of each memory mat. However other arrangements may be used in other examples. In the example shown in FIG. 4, each line of the word driver FXD may be coupled to a corresponding subword driver SWD0-7 in each memory mat. For example, FX line 5 may be coupled to the subword driver SWD5 of each memory mat.

In the example operation shown in FIG. 4, a row address RA has indicated MWD1 should be activated and odd word driver FXD 404 associated with word driver line FX 5 should be activated. As shown by the shaded regions 412, subword lines 410 associated with the unactivated main word drivers MWD0, MWDn remain inactive, even the subword lines associated with word driver line FX 5. However, the subword line 414 driven by subword driver SWD5 416 associated with activated MWD1 and FX 5 is activated. Thus, a selected subword line SWL of the selected memory mat MAT associated with MWD1 is driven to the active potential by the corresponding activated subword driver SWD5. The active potential may be provided by the row decoder as the voltage GROW.

Figure 5:
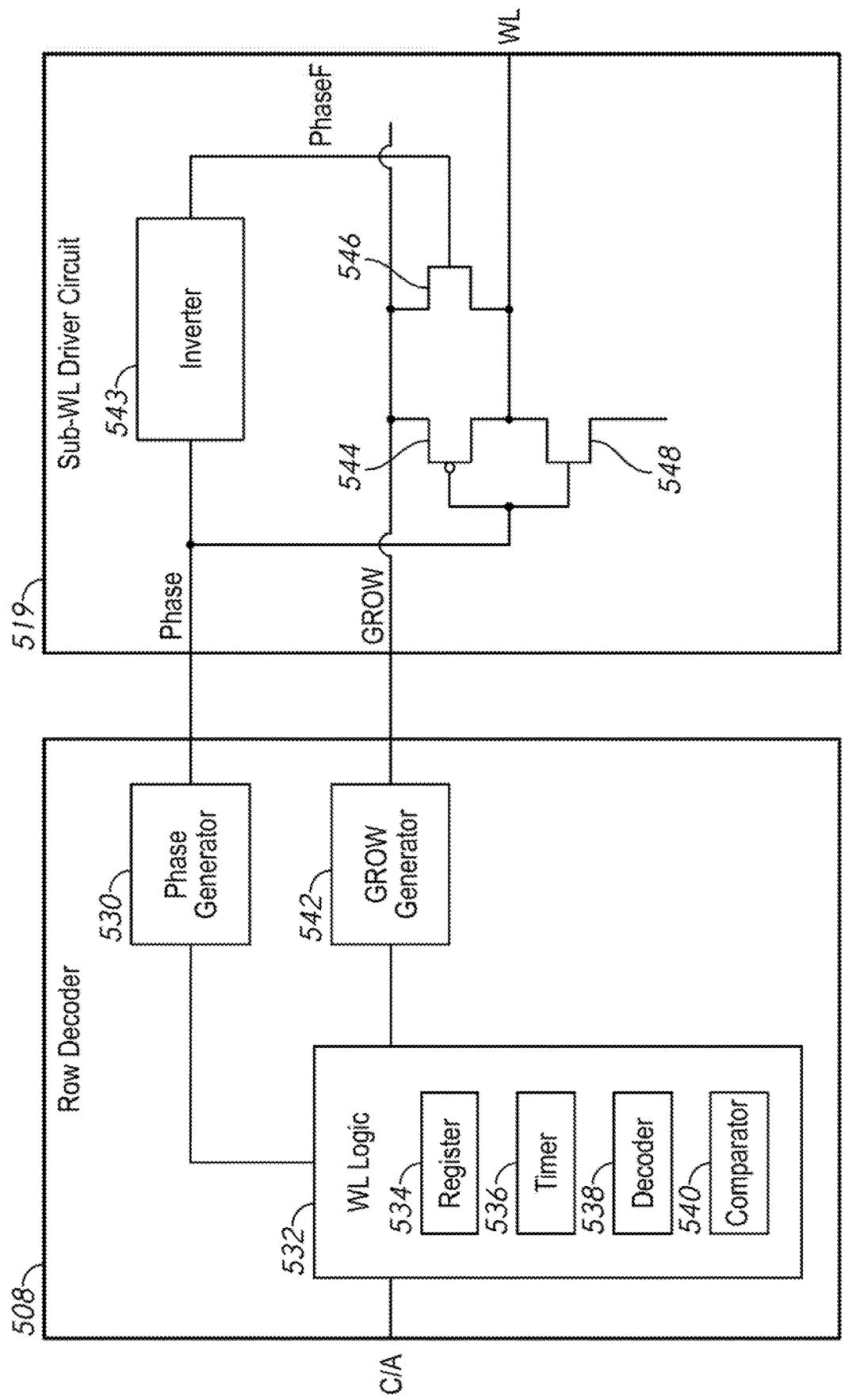
FIG. 5 is a block diagram of a row decoder and sub-word line driver according to an embodiment of the present disclosure.

FIG. 5 is a block diagram of a row decoder and sub-word line driver according to an embodiment of the present disclosure. The row decoder 508 may, in some embodiments, be included in the row decoder 108 of FIG. 1. The sub-word line driver circuit 519 may, in some embodiments, be included in the SWL driver 119 of FIG. 1.

The row decoder 508 may receive command and addresses (e.g., such as row addresses XADD). For purposes of clarity, the row decoder 508 is shown as having a single command and address terminal C/A, however multiple terminals may be used, each of which may receive commands, addresses, or both. The row decoder 508 may receive the addresses and /or commands at a word line logic circuit (WL logic) 532, which may determine which SWL drivers to signals to and the state (e.g., voltage) that the SWL driver(s) should set their associated word lines at. The row decoder 508 may provide a signal Phase, which has a state which indicates if a SWL driver 519 should activate or inactivate its associated word line and a signal GROW which may determine a voltage of the wordline when the wordline is activated by the signal Phase. For the sake of clarity, only a single SWL driver 519 in shown in the example of FIG. 5, however it should be understood that each row decoder 508 may be coupled to multiple SWL drivers (e.g., as described in FIGS. 3-4). The row decoder 508 may provide the signals Phase and GROW with separate values to each of the different SWL drivers. Each SWL driver may receive Phase and /or GROW at a different state/level from the other SWL drivers.

The WL logic 532 may receive the commands and addresses from the C/A terminal. The WL logic 532 may determine if the command and /or address requires a change the state of the signal Phase or the signal GROW provided to any of the SWL driver circuits 519 associated with the row decoder 508. If a change is called for, the WL logic circuit 532 may send one or more internal signals to the phase generator circuit 530 which provides the signal(s) Phase, and /or the GROW generator circuit 542 which provides the signals GROW at different voltage levels. In some embodiments, GROW generator 542 may have one or more preset voltage levels for the voltage GROW, and the WL logic may indicate which of the present levels the GROW generator 542 should provide for a given one of the voltages GROW.

The WL logic circuit 532 includes a decoder circuit 538 which determines which word line is associated with the received row address XADD. For example, different subsets of bits of the row address may refer to different levels of organization of the memory (e.g., as described in more detail in FIGS. 3-4). The decoder 538 may determine which group(s) a word line associated with the row address XADD is part of based on one or more bits of the received row address XADD.

In general, when a row address XADD and access command are received, the WL logic 532 may indicate that the SWL driver 519 associated with the row address XADD should be raised to an activated voltage for a period of time, and then changed to an intermediate voltage. For example, assume a word line WL associated with a row address XADD starts at an inactivated voltage (e.g., a ground voltage). The signal Phase provided to that word line by the phase generator 530 may be at an inactive level (e.g., a high logical level) which in turn may cause the SWL driver 519 to couple to the wordline to the inactivated voltage (e.g., a ground voltage such as VSS). When the access command and row address XADD are received, the WL logic circuit 532 (e.g., the decoder 538) may identify which SWL driver circuit 519 is associated with that row address XADD. The WL logic 532 may signal the GROW generator 542 and the phase generator 530. The phase generator 530 may provide the signal Phase at an active level (e.g., a low logical level), which may cause the SWL driver 519 to couple the word line WL to the voltage GROW. The GROW generator 542 may set the voltage GROW to an activated level. The GROW generator 542 may maintain the voltage GROW at the activated level for a set period of time (e.g., as indicated by internal logic of the GROW generator and /or instructions from the WL logic circuit 532) and then may provide the voltage GROW at an intermediate level. The row address XADD may then be added to the register 534.

The WL logic circuit 532 may include a register 534 and a comparator 540. The register 534 may store one or more row addresses (or other indications) of which word lines WL are currently at an intermediate voltage. The comparator circuit 540 may compare the received row address XADD to the address(es) stored in the register 534. Based on the comparison, the WL logic circuit 532 may signal the Phase generator 530 and /or GROW generator 542 to change the state of one or more word lines. The comparator circuit 540 may determine if the received row address XADD is part of the same group as one or more of the wordlines indicated by the address(es) stored in the register 534. If there is a match, the WL logic circuit 532 may inactivate the wordline(s) with address(es) stored in the register 534. For example, the WL logic 532 may indicate that the phase generator 530 should change the state of the signal Phase sent to the SWL drivers associated with the matched wordlines.

In some embodiments, if the wordline associated with the received row address XADD is the same wordline as one of the addresses stored in the register 534, then the WL logic circuit 532 may raise the word line WL to the activated voltage for a period of time and then return it to the intermediate voltage level without needing to inactivate it first. In some embodiments, the WL logic 532 may include a timer circuit 536, and the WL logic 532 may monitor how long each address is stored in the register 534. When an address has been in the register 534 for a maximum amount of time (e.g., when a word line has been at the intermediate voltage for a maximum amount of time), the WL logic 532 may signal the phase generator 530 to change the state of the signal Phase provided to that word line's SWL driver 519, which in turn may change the voltage of the word line to the inactivated voltage (e.g., a ground voltage). The counts of the timer circuit 536 may be compared to a threshold value, and if any of the counts exceeds that threshold value the word line associated with that count may be driven to the inactive voltage (e.g., by providing the signal Phase at an inactive level).

The SWL driver circuit 519 may receive the signals Phase and GROW and set a voltage of the word line W L based on those signals. The SWL driver circuit 519 may include an inverter circuit 543 which receives the signal Phase and provides a signal PhaseF which is complementary to the signal Phase. The SWL driver circuit 519 may include a first transistor 544, a second transistor 546 and a third transistor 548. The first transistor 544 has a source coupled to the voltage GROW, a drain coupled to the WL and a gate coupled to the signal Phase. The first transistor 544 may be a p-type transistor. The second transistor 546 may have a source coupled to the voltage GROW, a drain coupled to the WI, and a gate coupled to a signal PhaseF, which is an inverse of the signal Phase. The third transistor 548 may have a source coupled to an inactive voltage such as a ground voltage (e.g., VSS), a drain coupled to the WL and a gate coupled to the signal Phase.

When the signal Phase is at a high logical level, the first transistor 544 and the second transistor 546 may both be inactive, while the third transistor 548 may be active. Accordingly, when the signal Phase is at a high logical level, the word line WL may be coupled to an inactive voltage such as the ground voltage (e.g., VSS). When the signal Phase is at a low logical level, the first and second transistors 544, 546 may be active while the third transistor 548 may be inactive. Accordingly, when the signal Phase is at a low logical level, the voltage GROW may be coupled to the wordline WL through the transistors 544 and 546.

Figure 6:
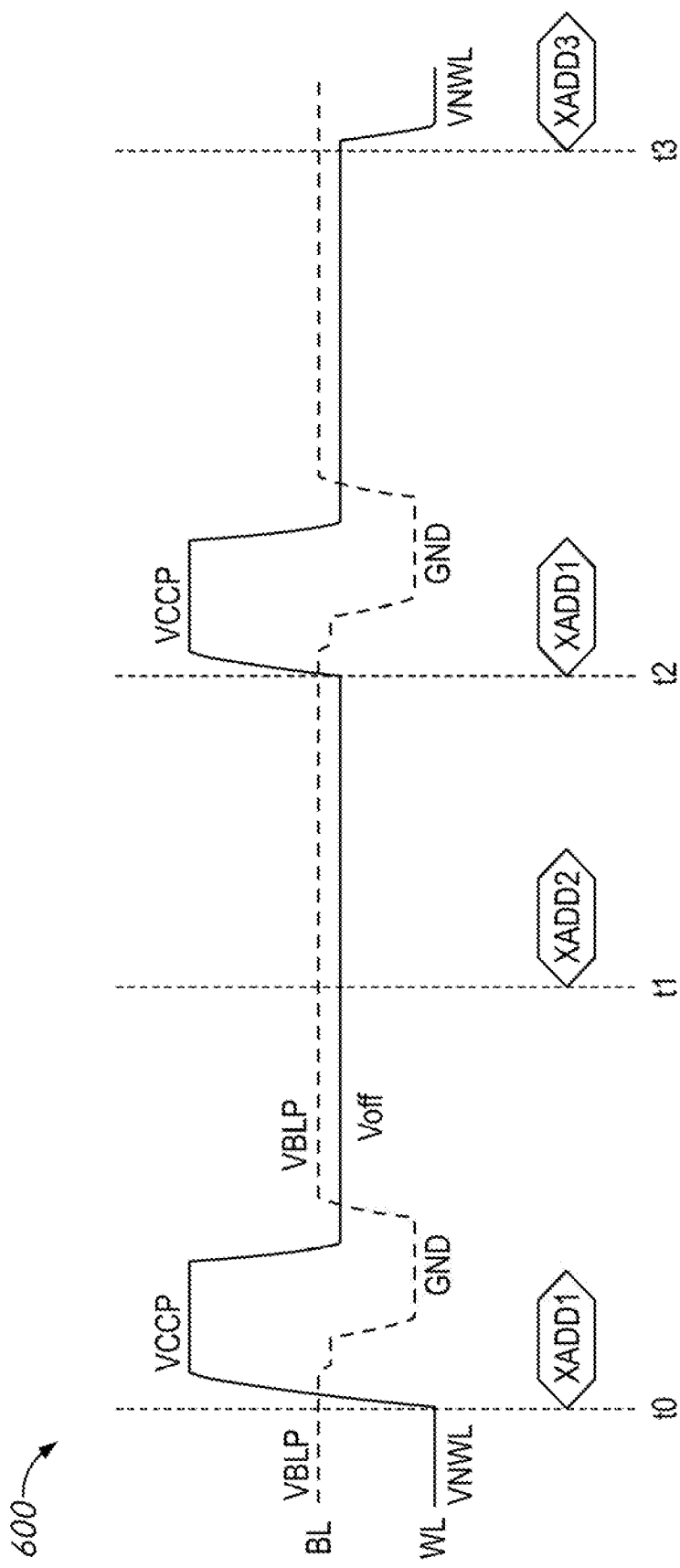
FIG. 6 is a timing diagram of an example voltage on word line according to an embodiment of the present disclosure.

FIG. 6 is a timing diagram of an example voltage on word line according to an embodiment of the present disclosure. The timing diagram 600 represents voltages of an example wordline WL and bit line BL as a row decoder receives different addresses over time. For the example, the word line WL may, in some embodiments, be coupled to the row decoder 508 and SWL driver 519 of FIG. 5.

At a time t0, the row decoder receives an access command directed to an address XADD. The address XADD1 may be part of a first group (e.g., a first bank). Before the time t0, the wordline WL may be at a first voltage which is an inactive voltage, here labeled VNWL. In some embodiments, VNWL may be a ground voltage such as VSS. Similarly, the bit line may be at a resting voltage VBLP. At the time t0 when the address XADD1 is received, the word line WL may be raised to a second voltage, which is an active voltage, here labelled VCCP. For example, the row decoder may provide the signal Phase to couple the word line WL to the voltage GROW, and may provide the voltage GROW at the voltage VCCP. The bit line may be reduced to a ground voltage GND.

A period of time after the voltage of the wordline is raised to VCCP, the voltage of the word line may be changed to a third voltage Voff which is an intermediate voltage. For example, the row decoder may continue to provide the signal Phase to couple the word line to the voltage GROW, but may change the voltage of GROW to Voff. The voltage of the bit line may be returned to VBLP. In the example embodiment of FIG. 6, the voltage VCCP may be a higher voltage than the voltage VNWL, and the voltage Voff may be between the voltages VCCP and VNWL.

At a first time t, a second row address XADD2 may be received. The address XADD2 may be associated with a wordline which is part of a different group of wordlines than the word line WL. For example, if the wordlines WL associated with the address XADD1 is part of a first bank, then the wordline associated with the address XADD2 may be part of a second bank. Since the address XADD2 is part of a different group than the WL, the row decoder may keep the word line WL at the intermediate voltage Voff. Note that the wordline associated with XADD2 may be raised to the voltage VCCP and then dropped to Voff.

At a second time t2, another access command may be received with the address XADD. This may cause the row decoder to once again raise the voltage of the WL to VCCP for a period of time before returning the voltage of the WL to Voff. Similarly, the BL may have its voltage changed to GND and then changed back to VBLP.

At a third time t3, an access command is received along with the address XADD3. The address XADD3 may be associated with a word line which is part of the same group of wordlines as the wordline WL. For example, the word line WL and the word line associated with XADD3 may both be in the same bank. Accordingly, since an access command was received directed to a wordline which is in the same group as WL, but not WL, the voltage of WL may be changed to the first voltage VNWL. Note that the time between t0 and t3 may be less than a maximum amount of time From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
    a first plurality of word lines including a first word line associated with a first row address; and
    a row decoder configured to provide a first voltage and then a second voltage to a first wordline responsive to receiving the first row address and configured to provide a third voltage to the first word line responsive to receiving a row address associated with one of the first plurality of word lines different from the first word line, wherein the first voltage is greater than the third voltage and wherein the second voltage is between the first voltage and the third voltage.

2. An apparatus comprising:
    a first plurality of word lines including a first word line associated with a first row address;
    a row decoder configured to provide a first voltage and then a second voltage to a first wordline responsive to receiving the first row address and configured to provide a third voltage to the first word line responsive to receiving a row address associated with one of the first plurality of word lines different from the first word line; and
    a second plurality of word lines, wherein the row decoder is further configured to maintain the first word line at the third voltage responsive to receiving a third address associated with the second plurality of word lines after receiving the first address.

3. The apparatus of claim 2, wherein the first plurality of word lines are part of a first memory bank and wherein the second plurality of word lines are part of a second memory bank.

4. An apparatus comprising:
    a first plurality of word lines including a first word line associated with a first row address; and a row decoder configured to provide a first voltage and then a second voltage to a first wordline responsive to receiving the first row address and configured to provide a third voltage to the first word line responsive to receiving a row address associated with one of the first plurality of word lines different from the first word line, wherein the row decoder comprises a timer configured to count an amount of time that the first word line is at the second voltage, and wherein the row decoder is configured to change the first word line to the third voltage responsive to the amount of time exceeding a threshold.

5. An apparatus comprising:
a first plurality of word lines including a first word line associated with a first row address; and
a row decoder configured to provide a first voltage and then a second voltage to a first wordline responsive to receiving the first row address and configured to provide a third voltage to the first word line responsive to receiving a row address associated with one of the first plurality of word lines different from the first word line, wherein responsive to receiving the first address while the first word line is at the second voltage level, the row decoder is configured to provide the first voltage and then return the first word line to the second voltage.

6. An apparatus comprising:
a first plurality of word lines including a first word line associated with a first row address;
a row decoder configured to provide a first voltage and then a second voltage to a first wordline responsive to receiving the first row address and configured to provide a third voltage to the first word line responsive to receiving a row address associated with one of the first plurality of word lines different from the first word line; and
a first sub-word line driver coupled to the first word line, wherein the row decoder is configured to provide a phase signal wherein responsive to the phase signal being in a first state the sub-word line driver is configured to activate the first word line and couple it to a voltage provided by the row decoder and wherein responsive to the phase signal being in a second state the sub-word line driver is configured to couple the first word line to the third voltage.

7. An apparatus comprising:
a group of word lines including a first word line;
a row decoder configured to provide a phase signal and a voltage; and
a first sub-word line driver circuit coupled to the first word line,
wherein the sub-word line driver circuit is configured to couple the first word line to an inactive voltage when the phase signal is in a first state, and configured to couple the first word line to the voltage provided by the row decoder when the phase signal is in a second state, and
wherein responsive to receiving a row address associated with the first word line the row decoder is configured to provide the phase signal at the second state and provide the voltage at a first level for a period of time and then provide the voltage at a second level until receiving a row address associated with a different word line of the group of word lines.

8. The apparatus of claim 7, wherein the row decoder comprises a register configured to store a plurality of row addresses associated with word lines of the group of word lines which are being provided the second voltage level.

9. The apparatus of claim 8, wherein the row decoder comprises a timer circuit configured to count an amount of time each of the plurality of row addresses are in the register, and wherein the row decoder is configured to provide the phase signal at the first state to one of the sub-word line drivers associated with one of the plurality of row addresses when its timer exceeds a threshold.

10. The apparatus of claim 8, wherein the row decoder comprises a comparator configured to compare a received row address to the plurality of row addresses stored in the register, wherein responsive to a match, the row decoder is configured to change the voltage provided to word line associated with the received row address from the second level to the first level and then back to the second level.

11. The apparatus of claim 7, wherein the group of word lines is a bank of word lines, a mat of word lines, or a sub-mat of word lines.

12. The apparatus of claim 7, wherein the row decoder comprises a decoder circuit configured to determine which group of word lines a word line associated with a received row address belongs to based on one or more bits of the received row address.

13. The apparatus of claim 7, wherein the second voltage level is between the first voltage level and the inactive voltage.

14. A method comprising:
receiving a first row address associated with a first word line;
driving, responsive to receiving the first row address, the first word line to a first voltage for a period of time and then driving the first word line to a second voltage;
receiving a second row address associated with a second word line, wherein the first word line and the second word line are part of a group of word lines;
driving, responsive to receiving the second row address, the first word line to a third voltage;
counting an amount of time the first word line is at the second voltage; and
driving, responsive to the amount of time exceeding a threshold, the first word line to the third voltage.

15. The method of claim 14, wherein the group of word lines is a bank, a memory mat, or a sub-mat.

16. The method of claim 14, further comprising accessing one or more memory cells associated with the first word line while the first word line is at the first voltage.

17. A method comprising:
receiving a first row address associated with a first word line:
driving, responsive to receiving the first row address, the first word line to a first voltage for a period of time and then driving the first word line to a second voltage;
receiving a second row address associated with a second word line, wherein the first word line and the second word line are part of a group of word lines;
driving, responsive to receiving the second row address, the first word line to a third voltage;
receiving the first row address while the first word line is at the second voltage; and
driving, responsive to receiving the first row address, the first word line to the first voltage for the period of time and then returning the first word line to the second voltage.

18. A method comprising:
receiving a first row address associated with a first word line;

driving, responsive to receiving the first row address, the first word line to a first voltage for a period of time and then driving the first word line to a second voltage;
receiving a second row address associated with a second word line, wherein the first word line and the second word line are part of a group of word lines;
driving, responsive to receiving the second row address, the first word line to a third voltage;
receiving a third row address associated with a third word line which is not part of the group of word lines; and
maintaining the first word line at the second voltage.

* * * * *